US010530353B2

United States Patent
Charpentier et al.

(10) Patent No.: US 10,530,353 B2
(45) Date of Patent: *Jan. 7, 2020

(54) GATE DRIVE CONTROL SYSTEM FOR SIC AND IGBT POWER DEVICES TO CONTROL DESATURATION OR SHORT CIRCUIT FAULTS

(71) Applicant: AGILESWITCH, LLC, Philadelphia, PA (US)

(72) Inventors: Albert J. Charpentier, Malvern, PA (US); Alan K. Smith, Phoenixville, PA (US); Nitesh Satheesh, Bensalem, PA (US); Robin Weber, Philadelphia, PA (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 36 days.

This patent is subject to a terminal disclaimer.

(21) Appl. No.: 15/767,058

(22) PCT Filed: Oct. 20, 2016

(86) PCT No.: PCT/US2016/057819
§ 371 (c)(1),
(2) Date: Apr. 9, 2018

(87) PCT Pub. No.: WO2017/070290
PCT Pub. Date: Apr. 27, 2017

(65) Prior Publication Data
US 2019/0267982 A1    Aug. 29, 2019

Related U.S. Application Data

(63) Continuation-in-part of application No. 15/074,364, filed on Mar. 18, 2016, now Pat. No. 9,490,798.
(Continued)

(51) Int. Cl.
*H03K 17/60*    (2006.01)
*H03K 17/04*    (2006.01)
(Continued)

(52) U.S. Cl.
CPC ......... *H03K 17/0406* (2013.01); *H03K 3/012* (2013.01); *H03K 5/24* (2013.01);
(Continued)

(58) Field of Classification Search
None
See application file for complete search history.

(56) References Cited

U.S. PATENT DOCUMENTS

| 4,777,579 A | 10/1988 | Jahns et al. |
| 8,984,197 B2 | 3/2015 | Charpentier |

(Continued)

FOREIGN PATENT DOCUMENTS

| EP | 2584701 A2 | 4/2013 |
| EP | 2884664 A1 | 6/2015 |

OTHER PUBLICATIONS

International Preliminary Report on Patentability and Written Opinion for International Application No. PCT/US2016/057819, dated Apr. 24, 2018, 7 pages.
(Continued)

*Primary Examiner* — Long Nguyen
(74) *Attorney, Agent, or Firm* — RatnerPrestia

(57) ABSTRACT

A gate-drive controller for a power semiconductor device includes a master control unit (MCU) and one or more comparators that compare the output signal of the power semiconductor device to a reference value generated by the MCU. The MCU, in response to a turn-off trigger signal, generates a first intermediate drive signal for the power semiconductor device and generates a second intermediate drive signal, different from the first drive signal, when a
(Continued)

DSAT signal indicates that the power semiconductor device is experiencing de-saturation. The MCU generates a final drive signal for the power semiconductor when the output signal of the one or more comparators indicates that the output signal of the power semiconductor device has changed relative to the reference value. The controller may also include a timer that causes the drive signals to change in predetermined intervals when the one or more comparators do not indicate a change.

31 Claims, 12 Drawing Sheets

Related U.S. Application Data

(60) Provisional application No. 62/244,325, filed on Oct. 21, 2015, provisional application No. 62/393,859, filed on Sep. 13, 2016.

(51) Int. Cl.
*H03K 5/24* (2006.01)
*H03K 3/012* (2006.01)
*H03K 17/042* (2006.01)
*H03K 21/08* (2006.01)
*H03K 17/16* (2006.01)

(52) U.S. Cl.
CPC ..... *H03K 17/04206* (2013.01); *H03K 17/168* (2013.01); *H03K 21/08* (2013.01)

(56) References Cited

U.S. PATENT DOCUMENTS

| | | | | |
|---|---|---|---|---|
| 9,490,798 | B1* | 11/2016 | Charpentier | H03K 17/04206 |
| 2007/0200602 | A1* | 8/2007 | Ishikawa | H03K 17/0406 327/110 |
| 2008/0122497 | A1 | 5/2008 | Ishikawa et al. | |
| 2011/0169549 | A1 | 7/2011 | Wu | |
| 2012/0013371 | A1 | 1/2012 | Nakatake et al. | |
| 2015/0035584 | A1 | 2/2015 | Fujita | |
| 2015/0162905 | A1* | 6/2015 | Wagoner | H03K 17/0412 327/432 |
| 2015/0311692 | A1* | 10/2015 | Hiyama | H03K 17/0828 361/31 |
| 2016/0182034 | A1* | 6/2016 | Wagoner | H03K 17/163 327/432 |

OTHER PUBLICATIONS

International Search Report and Written Opinion for International Application No. PCT/US2016/057819, dated Jan. 24, 2017, 9 pages.
Domes et al., "IGBT-Module Integrated Current and Temperature Sense Features Based on Sigma-Delta Converter", Infineon Technologies, 2009, 6 pages.
Motto et al., "IGBT Module with User Accessible On-Chip Current and Temperature Sensors", IEEE, 2012, pp. 176-181.

* cited by examiner

GATE DRIVE CONTROL SYSTEM FOR SIC AND IGBT POWER DEVICES TO CONTROL DESATURATION OR SHORT CIRCUIT FAULTS

This application is the U.S. national phase application of PCT International Application No. PCT/US2016/057819 filed Oct. 20, 2016, which claims benefit of priority from U.S. Provisional Application Ser. No. 62/244,325 filed Oct. 21, 2015 and from U.S. Provisional Application Ser. No. 62/393,859 filed Sep. 13, 2016 and is a continuation-in-part of U.S. patent application Ser. No. 15/074,364 filed Mar. 18, 2016, the contents of these applications are incorporated herein by reference.

BACKGROUND OF THE INVENTION

Power Semiconductor Devices, IGBTs (Insulated Gate Bipolar Transistors) or FETs (Field Effect Transistors) based on silicon (Si), silicon carbide (SiC) Gallium Nitride (GaN) and other Wide Bandgap materials (WBGs) such as diamond, aluminum nitride (AlN), and boron nitride (BN), are used in high power inverters, motor control, battery control systems, etc. SiC and GaN FETs are becoming a popular option for high power systems. These wide band gap devices have faster switching speeds and are more efficient than Si IGBTs. The improved efficiency is a result of the faster switching speed. Faster switching reduces the switching losses and, by switching at a higher frequency, smaller inductors and capacitors can be used than would be used for devices having lower switching speeds. The combination of lower losses and smaller external filter components makes SiC devices an attractive alternative to the IGBT.

SUMMARY

In one embodiment, a gate-drive controller for a power semiconductor device includes a master control unit (MCU) and a comparator that compares an output signal of the power semiconductor device to a reference value. The MCU, in response to a turn-off trigger signal, generates the reference value and a first intermediate drive signal for the power semiconductor device. The MCU generates a different reference value and a different intermediate drive signal when a desaturation (DSAT) signal indicates that the power semiconductor device is experiencing de-saturation. The MCU generates a final drive signal for the power semiconductor when the comparator indicates that the output signal from the power semiconductor device is less than the reference value.

In another embodiment, a gate-drive controller includes an MCU that generates a first drive signal for the power semiconductor device when a trigger signal indicates that the power semiconductor device is to be turned off, holds the first drive signal for a first predetermined time interval, provides a second drive signal, different from the first drive signal, at the end of the first predetermined time interval, holds the second drive signal for a second predetermined time, and provides a third drive signal, different from the first and second drive signals, at the end of the second predetermined time interval.

In yet another embodiment, The MCU receives a trigger pulse having a rising edge and a falling edge. In response to detecting the rising edge of the trigger pulse, the MCU generates a first reference value and a first drive signal to partially turn-on the power semiconductor device. When the output signal of the comparator changes state, the MCU generates a second drive signal to fully turn on the power semiconductor device. In response to the falling edge of the trigger pulse, the MCU generates a second reference value and a third drive signal for the power semiconductor device to turn the power semiconductor device partially off. When the output signal of the comparator changes back to its original state, the MCU generates a fourth drive signal to turn fully turn off the power semiconductor device.

In a still further embodiment, the MCU monitors Vce or Vds, depending on the type of device being controlled, to determine when to step to the next voltage level in the multi-level turn off (MLTO) sequence. The MCU uses two comparators to determine when the over voltage spike rises above a first predetermined voltage, VCHK1, and falls below a second predetermined voltage, VCHK2. These voltage values change with each step. When the two comparators indicate that Vce/Vds is in the range of voltages, the next step in the turn-off process can proceed. Knowing when to move to the next voltage level based on the value of Vce/Vds allows the MLTO process to be optimized and shut down the power device as quickly as possible to minimize any possible damage. The MCU may also monitor a timer set at each step to proceed with the next step at a time indicated by the timer even if the comparators do not indicate that the next step is due.

DETAILED DESCRIPTION OF THE INVENTION

The higher switching speed of the SiC devices may create a control problem. The fast turn-on and turn-off time coupled with the stray inductance of the system may result in relatively high-voltage switching spikes when the devices are turned off and ringing on the output voltage signals when they are turned on. The spikes and ringing are directly related to the inductance, L, in the system ($V=L*dI/dt$). For example a power semiconductor device that switches 200

Amps in 50 ns with only 50 nH of inductance may create a 200V spike. This large a spike may limit the usefulness of the SiC device.

Figure 1A:
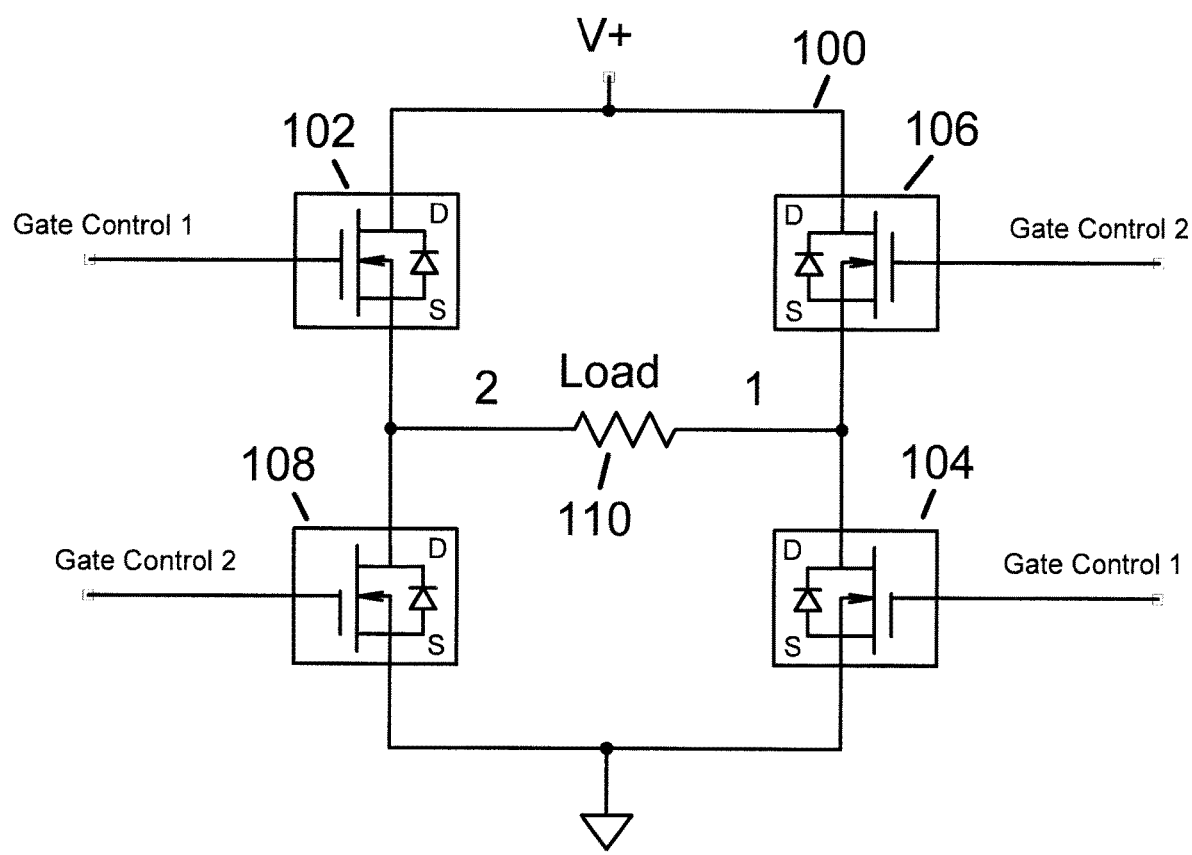
FIG. 1A is a schematic diagram of a bridge circuit including four power FETs.
Figure 1B:
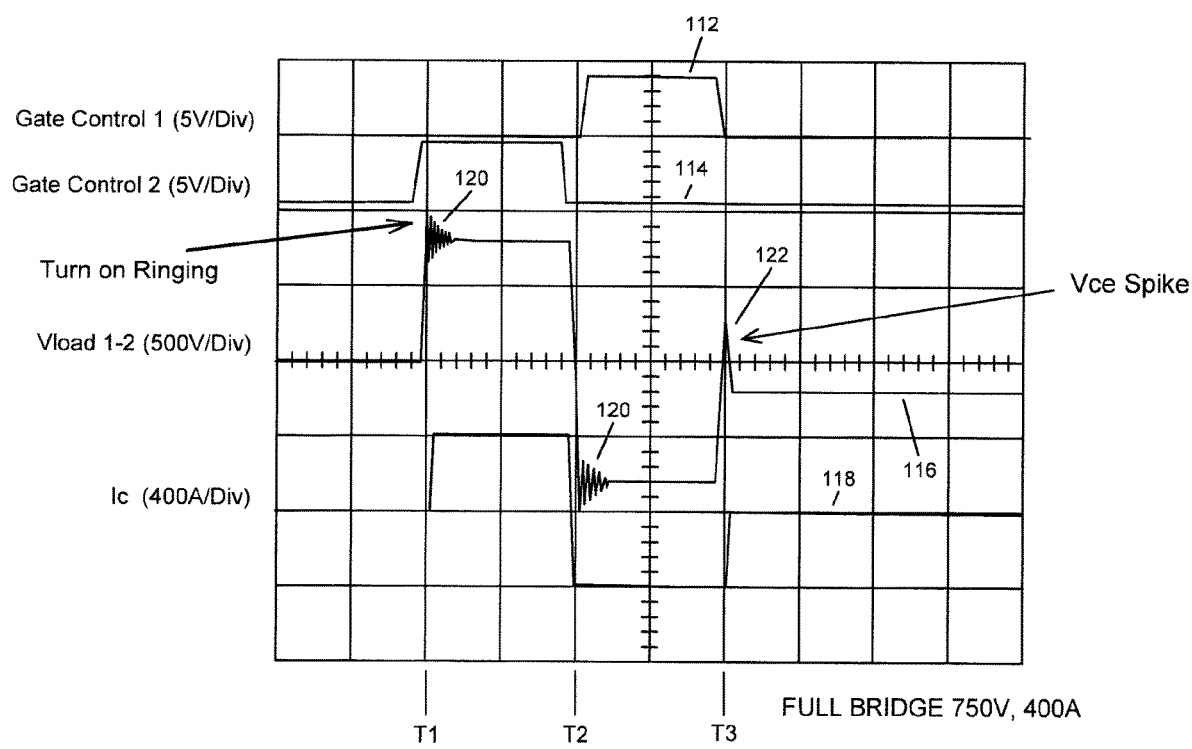
FIG. 1B is a graph showing waveforms of voltage versus time and current versus time that is useful for describing the operation of the circuit shown in FIG. 1A.

FIGS. 1A and 1B show turn-on ringing and turn-off spikes across the load of a bridge circuit. The circuit 100 shown in FIG. 1A includes four power FETs, 102, 104, 106 and 108 arranged as a bridge circuit to provide power to a load, illustrated as a resistor 110. FETs 102 and 104 are controlled by a voltage gate control 1 while FETs 106 and 108 are controlled by a voltage gate control 2. FIG. 1B is a graph showing gate control 1 (112), gate control 2 (114), the voltage across the load (116) and the current through the load (118). At time T1, gate control 2 transitions to high, turning on FETs. 106 and 108. This causes current to flow through the load from terminal 1 to terminal 2. As shown, the rapid switching also causes ringing 120 on the voltage across the load. This ringing is caused by parasitic inductance in the circuit. At time T2, gate control 2 transitions to low and gate control 1 transitions to high. This switches off FETs 106 and 108 and switches on FETs 102 and 104, causing current to flow through the load in the reverse direction, from terminal 2 to terminal 1. This switching also generates ringing 120 at time 2 in the voltage across the load. At time T3, gate control 1 transitions to low, turning off FETs 102 and 104, switching off the current to the load 110. The switching off of the current causes a spike 122 in the voltage across the load 110.

Existing systems use a resistor to reduce the gate charging current and, thus, slow down the switching time of the SiC device to reduce the spikes and ringing. Unfortunately slowing down the switch time over the entire switching period dramatically reduces the efficiency of the system. A solution is needed to control and optimize the switching speed to maintain efficiency while reducing turn-off voltage spikes and turn-on ringing.

While the example control circuits are shown as using SiC power FETs, it is contemplated that they may be used with other types of power FETs or with IGBT power semiconductors. Consequently, as used herein, the term Vce, which refers to the voltage across the power semiconductor device refers to the collector-to-emitter voltage of an IGBT or to the source-to-drain voltage of a power FET. Similarly, the term Ic refers to the current flowing through the conductive channel of the device which may be the collector current of the IGBT or the source current of the power FET. This current may be measured at either the collector or emitter of the IGBT or at the source or drain of the power FET.

One way to manage the high voltage turn-off spike is to turn the devices off in two levels. This is referred to herein as two-level turn-off (2LTOff). A system that implements 2LTOff first drives the gate of the power semiconductor device to an intermediate voltage level and, after a predetermined interval or when a predetermined Vce or Ic value is measured, drives the gate to its final off voltage state. The purpose of this function is to increase the dynamic on-resistance of the FET to reduce the current flowing through the device and, thus, to reduce dI/dt and the magnitude of the spike. The use of 2LTOff allows the user to improve the switching characteristics for the best tradeoff between efficiency and voltage turn-off spike.

Figure 2:
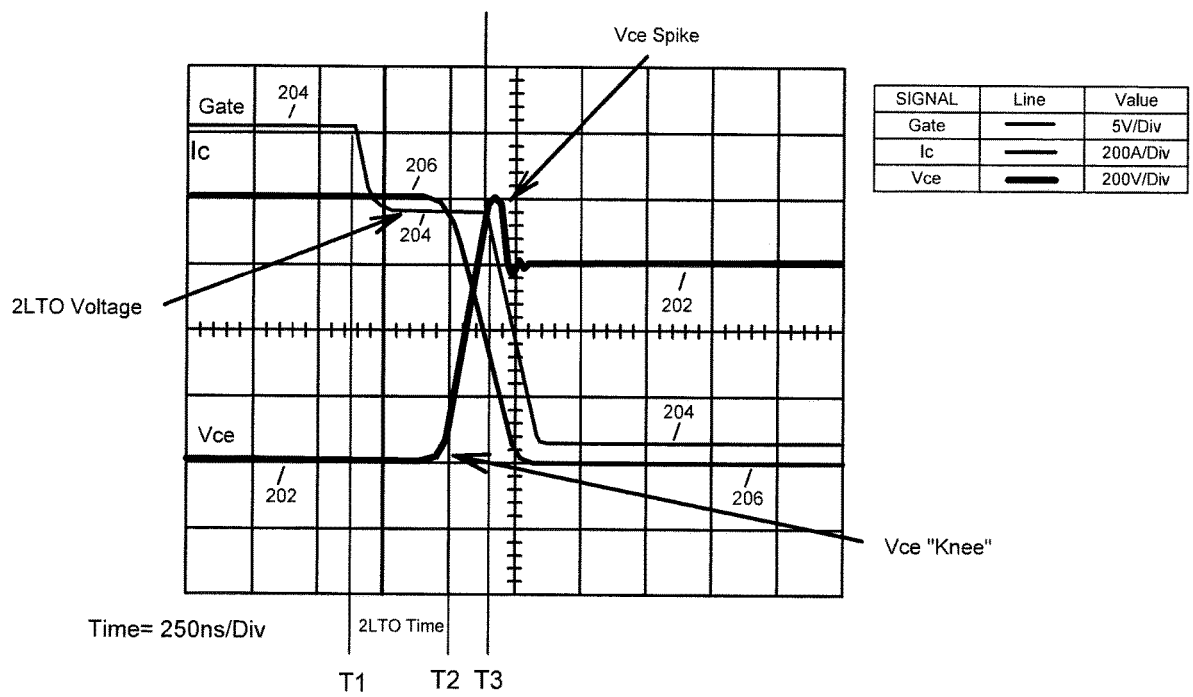
FIGS. 2 and 3 are graphs showing waveforms of voltage versus time and current versus time that is useful for describing example control circuits.
Figure 3:
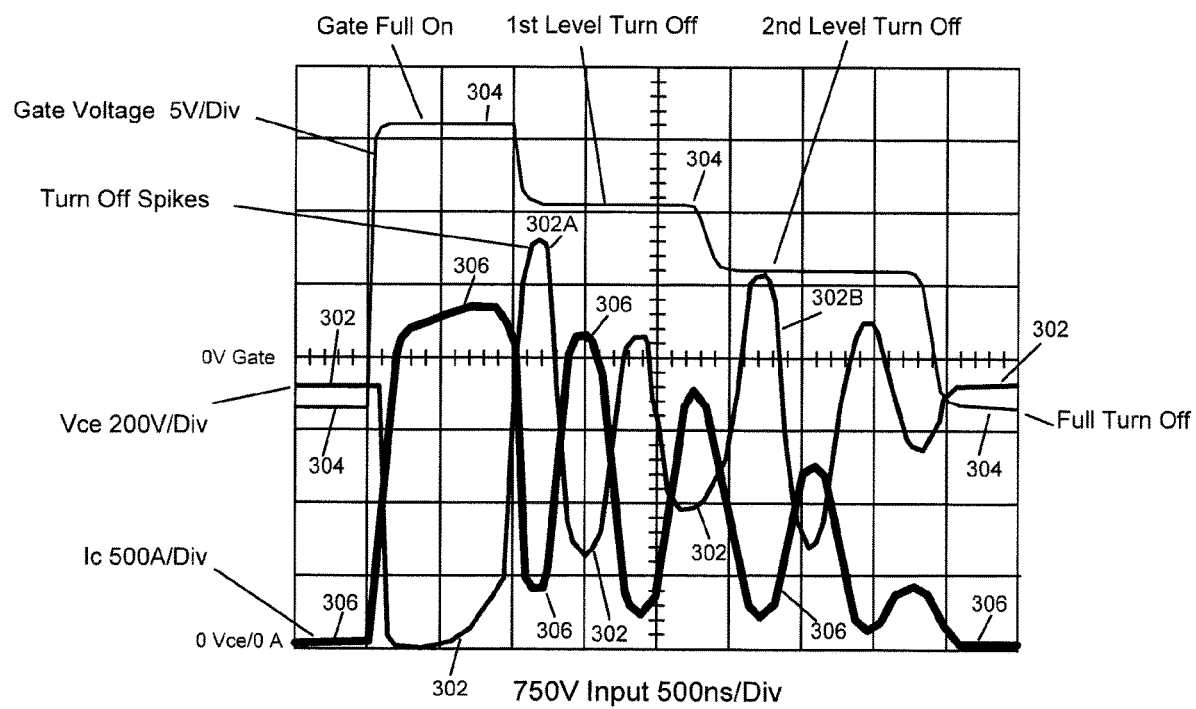

FIG. 2 shows example waveforms occurring during a 2LTOff operation. Before time T1, the gate voltage 204 is high and the device is turned on. The current, Ic 206, flowing through the device is high and the voltage across the device, Vce 202, is low. At time T1, the gate voltage 204 drops to an intermediate value, 2LTO, which increases the dynamic on-resistance of the device. The 2LTO voltage level is held on the gate for a 2LTO time which ends at T3. At time T3, the gate voltage transitions 204 to its low value. Shortly after time T2, the FET turns off resulting in a voltage spike on the Vce signal 202. At T2, before the end of the 2LTO time, Vce begins to rise (Vce knee). As described below, this rise in Vce may be detected by a comparator to cause the MCU to apply the turn-off gate voltage before the end of the 2LTO time, As an alternative to the two-level turn-off or turn-on, a multi-level turn or turn-on and/or turn-off (MLTO) may provide even better spike and ring suppression. In a multi-level method, the gate voltage is changed in three or more steps. This is illustrated in FIG. 3. In this example, the gate voltage 304 controls the device as shown by the graphs of Vce 302 and Ic 306. As shown, before time T0, the gate voltage 304 is low and the device is turned off (Vce 302 is high and Ic 305 is low). At time T0, the gate voltage transitions to high, turning on the device. At time T1, the gate voltage drops to its first intermediate level, resulting in a voltage spike 302A on the Vce signal 302. This first intermediate level is held for a first time interval from T1 to T2, and, at T2, the gate voltage is reduced to a second intermediate level. This results in a second voltage spike 302B, after time T2. After a second hold time, between time T2 and T3, the gate voltage transitions to low and the device is turned off. It is noted that there is no voltage spike following time T3. Furthermore, the voltage spikes 302A and 302B are much smaller than if the gate voltage had transitioned from high to low in a single step.

A Desaturation (DSAT) condition occurs in a Power Semiconductor (FET, other Wide Band Gap Devices, or IGBT) Device when the device is conducting current and the voltage across the device, VDS, increases beyond a predetermined level such that the power dissipated in the device will lead to catastrophic failure. In a DSAT condition the current passing through the device may be much larger than in normal operation. When this excess current in the device is turned off quickly, any inductance in the system will create a voltage spike according to the equation V=L*dI/dt. In SiC Power FETs, the turn-off time is less than 50 ns. This short turn-off time can result in a very large voltage spike, e.g. in a circuit with 15 nH of stray inductance during a DSAT condition with 3000 A, the turn-off voltage spike is 15 nH×3000 A/50 ns=900V. This voltage, on top of the DC voltage across the device (typically 700V for a device rated at 1200V) results in an overvoltage spike of 1600V-well beyond the max withstand voltage of 1200V.

Two solutions may be used to combat DSAT. One is to increase the gate resistance even more to attempt to manage the voltage spike while the other is to use 2LTOff to shut down the device. Increasing the gate resistance, however, further reduces the power efficiency of the device during normal operation. If 2LTOff is already used to control the turn off spike in normal operation it may not be effective to control the spike in a DSAT condition. One solution may be to use a gate resistor to control the turn off voltage spike during normal operation and use 2LTOff to turn the device off when a DSAT condition is detected. The example apparatus and method described below allows two types of turn-off functions, one set of parameters (the intermediate voltage and time) may be used during normal operation and a second set of parameters (for higher voltage and time) when a DSAT condition has been detected.

A third solution is to use two sets of multi-level turn off (MLTO) parameters for both normal operation and for a DSAT condition. Note that 2LTOff is a subset of Multi-Level turn off which uses two or more intermediate levels during a turn-off operation. The apparatus described below may be used to implement a solution employing a set of two multi-Level turn off parameters. During DSAT, a multi-level solution employing more than two levels may be the best solution to effectively manage the magnitude of the dI/dt, and, thus, the magnitude of the voltage spike. Example systems that implement switching after a DSAT condition is detected are described below with reference to FIGS. 9-12.

Two-level turn-on (2LTOn) is similar to 2LTOff, allowing a power semiconductor device to be turned on quickly without generating high-voltage ringing. The FET gate signal is first turned on to an intermediate level, it remains at that level for a time interval, and then changes to the final voltage level at which the device is turned fully on.

Some of the systems and methods described below also add real time monitoring of Vce to manage the timing for the switching characteristics of the SiC or IGBT device for both 2LTOff and 2LTOn (as used herein, the term 2LTO can refer to either 2LTOn or 2LTOff). Two-level turn-on (2LTOn) is similar to 2LTOff except that it is used during turn on. Other systems and methods monitor current or detect Vce overshoot.

Vce Monitoring

The main purpose of the 2LTO function is to allow the FET to change the on/off resistance gradually at the beginning of the switching cycle to reduce or manage dV/dt and dI/dt. As can be seen in FIG. 2, Vce begins to move slightly higher (the resistance of the FET increases) during the 2LTO period. This is shown in FIG. 2 as the "Vce knee." This initial soft change allows the amperage in the stray inductance to change more gradually and the effect is that the turn off spike is reduced.

Figure 4:
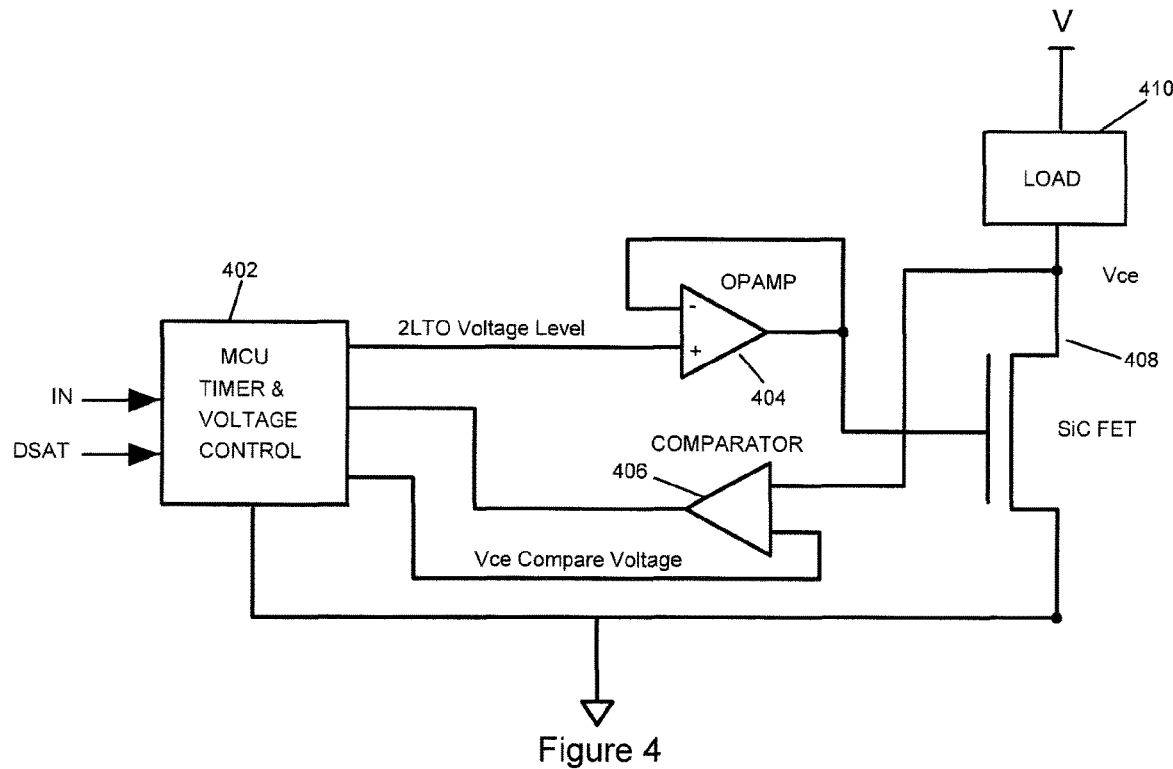
FIG. 4 is a schematic diagram of an example control circuit that controls switching based on Vce.

One method for controlling the 2LTO function to monitor the Vce of the FET using a comparator 406 as shown in FIG. 4. In this system, a master control unit (MCU) 402 receives an input signal IN that goes high when the FET is to be turned on and goes low when the FET is to be turned off. The signal IN may be a digital signal or an analog signal. In addition, the MCU receives a Boolean signal from the comparator 406 and generates a 2LTO analog voltage level that is applied to an operational amplifier (op amp) driver 404 which, in turn, provides the gate voltage to the SiC FET 408. The MCU 402 also generates a reference analog voltage level Vce Compare, that is applied to one input terminal of the comparator 406. The other input terminal of the comparator is coupled to the source terminal of the FET 408 to monitor the Vce level. As shown in FIG. 4, the source terminal of the FET 408 is connected to a load 410, that receives operational power from a voltage source, V. When the Vce level equals or exceeds the Vce Compare value, the comparator 406 generates a Boolean output signal that transitions from low to high. This Boolean signal is applied to the MCU 402 which controls the gate voltage to complete the 2LTO operation. As described below, instead of monitoring Vce, the comparator 406 may be configured to monitor Ic or a voltage proportional to Ic. To ensure proper voltage levels, both the MCU 402 and the FET 408 are coupled to a common source of reference potential (e.g. ground).

Although the circuit shown in FIG. 4 uses a single comparator monitoring either Vce or Ic, it is contemplated that multiple comparators (not shown) may be used, one for each monitored voltage or current level. This may be desirable when the DAC used by the MCU cannot change the reference voltage on the comparator in time for the next transition. As described above, a separate comparator (not shown) may also be used to monitor Vce to detect a DSAT condition. This comparator would detect a voltage level greater than the normal on-level. The MCU may detect a DSAT condition when it has turned the power semiconductor device on and the output signal of the comparator indicates a voltage value greater than or equal to the DSAT voltage value.

In the examples described below, the MCU may be a programmable control unit including internal analog-to-digital converters (ADCs) and digital-to-analog converters (DACs) (not shown) that allow it to receive and provide analog output signals. Alternatively, the MCU may be implemented as an application specific integrated circuit (ASiC), a complex programmable logic device (CPLD), a field-programmable gate array (FPGA) or discrete control logic, each having or being coupled to ADCs and DACs to receive and provide the analog signals while performing the operations described below with reference to FIGS. 7, 8, 10 and 11. As another alternative, the MCU 402 and driver 404 may include circuitry such as the MCU, interface board and driver board of the system described in U.S. Pat. No. 8,984,197 entitled POWER STACK CONTROL SYSTEMS, by Charpentier et al. which is incorporated herein by reference.

In FIG. 4, the MCU 402 provides the VCE compare voltage to the comparator 406. This level is set by performing a characterization of the system to determine the optimal level to manage the size of the turn-off spike or the turn-on dI/dt for a particular application. It is desirable to determine this value for each circuit design as the inductance of each design may be different. For example the MCU may set the Vce turn-off level to 10V. Once a Vce level of 10V is achieved, 2LTOff time would stop and the MCU would apply a low(off) signal to the gate of the FET, causing the FET to turn off. As another example, for 2LTOn, the MCU may set the Vce comparator level to VCC-10V. Once Vce goes below that level, 2LTOn would stop and the MCU would cause the signal applied to the gate of the FET to transition to the on (high) level. Given that the voltage levels for power systems can be as high as 800V or more, it may be desirable to use an isolated comparator or level shift circuitry (not shown) to monitor the 2LToff and 2LTOn conditions separately. This allows the comparator to monitor, for example, a 2LTOn of VCC-10V with an isolated comparator output to the MCU.

Ic Monitoring

In certain IGBT and SiC devices the manufacturer provides a secondary output pin that is proportional to the main output current. This output pin may be, for example, the drain electrode of a smaller FET (not shown) having source and gate electrodes connected in parallel with the source and gate electrodes of the power FET in a current mirror configuration. This output pin allows the system to shunt the secondary current into a low-ohm resistor (not shown) coupled between the drain of the smaller FET and ground, to create a monitoring voltage that is a function of the total current through the FET. In some systems it is possible to use a shunt resistor in the main current output to create a measureable voltage that is used instead of the current mirror structure. The voltage output across the low-ohm resistor or shunt resistor is monitored by the comparator and when the voltage reaches the level applied by the MCU (e.g. 2LTOff or 2LTOn), the MCU drives the FET fully off or on.

Figure 5:
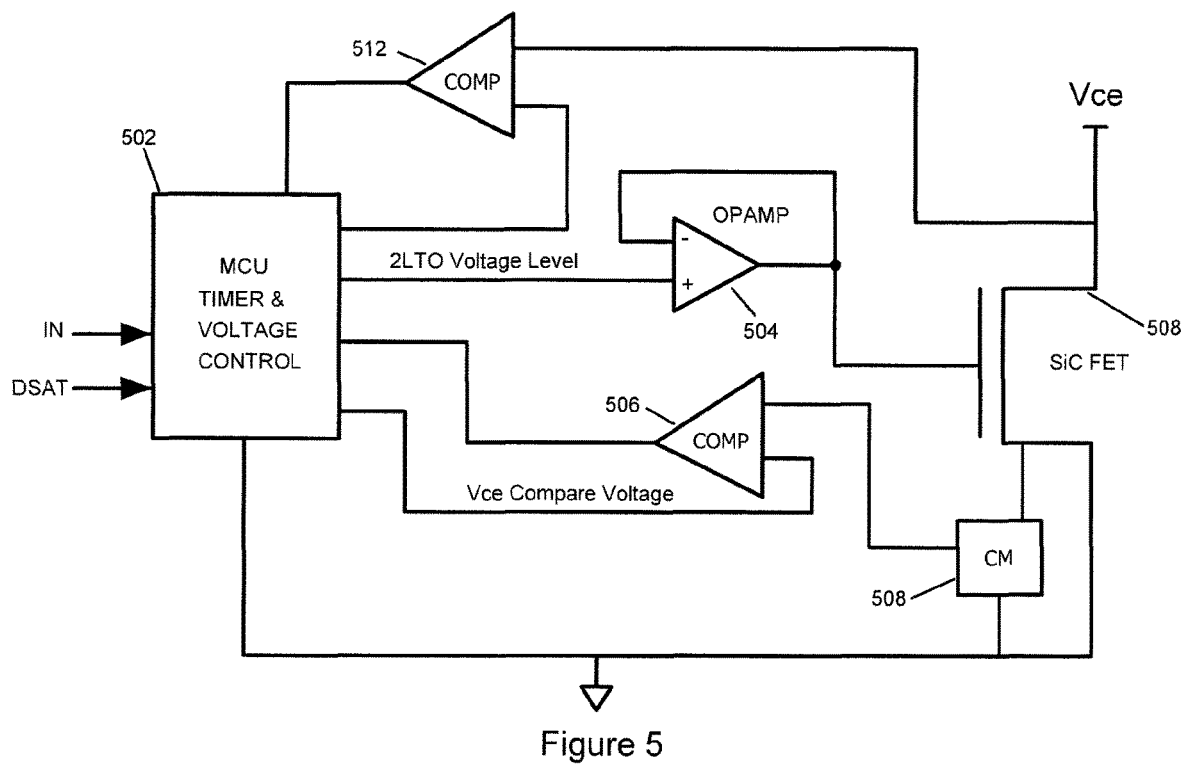
FIG. 5 is a schematic diagram of an example control circuit that controls switching based on Ic.

An example Ice monitoring system is shown in FIG. 5. It includes an MCU 502 which may be the same as the MCU 402 shown in FIG. 4. The example system also includes an op-amp driver circuit 540 and a comparator 506 that may be the same as the op-amp 404 and comparator 406 shown in FIG. 4. The output signal of the driver 540 is coupled to the gate of the SiC FET 508. In this implementation, the TLTOn and TLTOff values and times would be set by the MCU based on the circuit design and the monitored current signal from the current mirror output CM of the FET or IGBT 508 in the same way as described above with reference to FIG. 4. FIG. 5 also includes comparator 512 (shown in phantom) that is coupled to receive Vce from the FET 508 and to receive a second reference value from the MCU 502. When comparator 512 is added to the controller, the controller may perform TLTOn, TLTOff or both based on Ic, Vce or both.

Real Time 2LTOff and 2LTOn Adjustment

This feature utilizes the amount of time that it takes for Vce or Ice to reach a level that trips the comparator. The time is monitored by the MCU by using the MCUs internal clock (digital timer set, counts down to zero). The timer "set" value is based on characterization of the IGBT or SiC FET device obtained through double pulse testing or other form of dynamic tests on the circuit that includes the IGBT or SiC FET.

Figure 6:
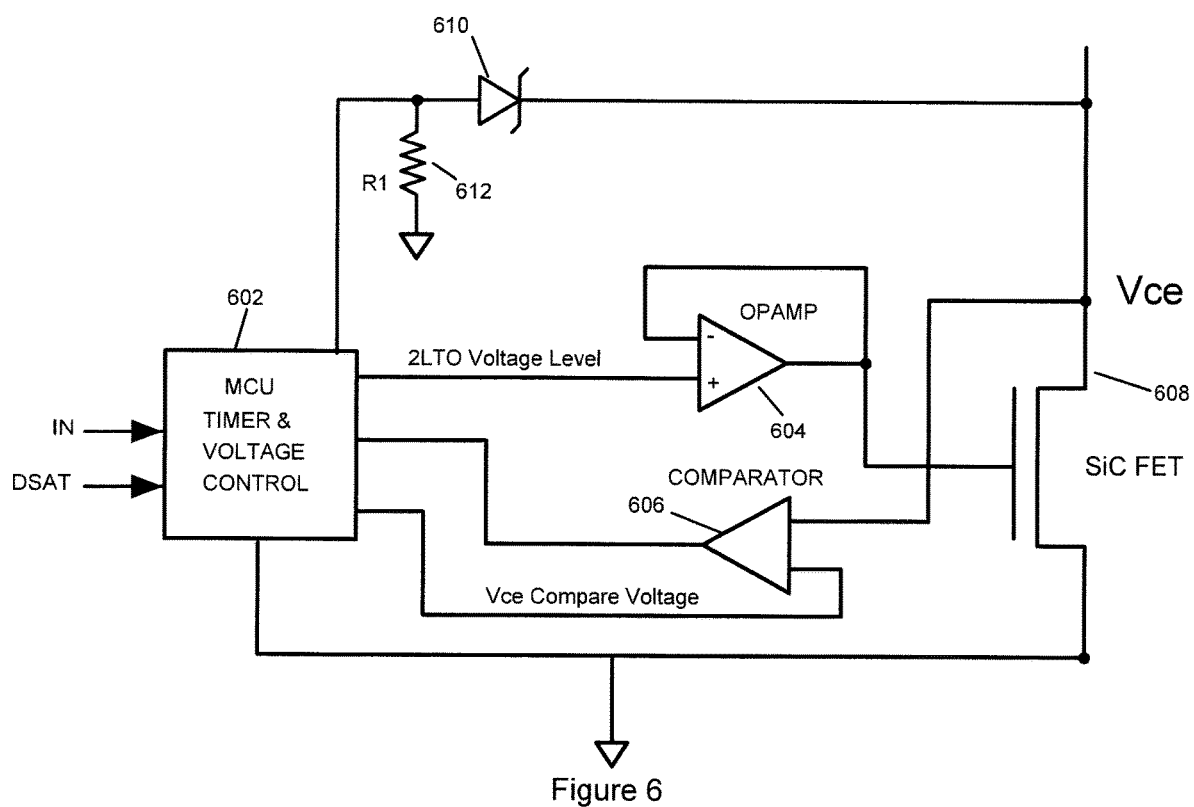
FIG. 6 is a schematic diagram of an example control circuit that controls switching based on Vce and includes a Vce overshoot monitor.

An example system that makes this adjustment is shown in FIG. 6. The system includes an MCU 602, op-amp 604 and comparator 606 that otherwise operate in the same way as the MCU 402, op-amp 404 and comparator 406 shown in FIG. 4 except that, in FIG. 6, the MCU monitors ringing on the Vce signal and Vce voltage spikes to determine if the TLTOn or TLTOff values or times should be adjusted. The monitoring circuit includes the Zener diode 610 and resistor 612. If the time is too long or short then the MCU can adjust the 2LTOff or 2LTOn levels and/or times to force the FET to change state at a different voltage levels or at a different rate and thus optimize the overshoot, dI/dt and the efficiency of the switching characteristics.

This function uses the Zener diode 610 to first determine that Vce has crossed a level as defined by the breakdown of the Zener diode 610. The Zener diode is selected to have a breakdown voltage that is greater than Vce by an acceptable overshoot (spike or ringing) value. If the diode breaks down, a voltage develops across the resistor 612. This voltage means that overshoot is too high and the MCU either increases the 2LTOff level, decreases the 2LTOff level, or increases the hold time. This modification may be made in steps to reduce the Vce overshoot to a level below the diode breakdown level.

Although the circuits shown in FIGS. 4-6 include an op-amp configured as a unity-gain amplifier as gate drive circuit, it is contemplated that the drive circuit may be eliminated or implemented using different technology. For example, the drive circuit may be implemented internal to the MCU such that the signal provided by the MCU conveys sufficient current to switch the gate of the FET or IGBT quickly. Alternatively, the op-amp may be replaced by another buffer amplifier, such as a push-pull amplifier.

In any of the circuits described above, the best 2LTOn and 2LTOff potentials to be used for a particular device may change based on the age or temperature of the FET or IGBT. To compensate for these changes, the MCU may include an internal clock that measures how long each power semiconductor device has been in use and may be coupled to a temperature sensor (e.g. a thermistor or thermocouple (not shown)) to determine the instantaneous temperature of the device. These values may be applied to a formula to adjust the 2LTOn and/or 2LTOff gate voltage values and delay times to compensate for age and/or temperature. The particular formula used is dependent on the structure and configuration of the power semiconductor device and may be determined empirically.

Figure 7:
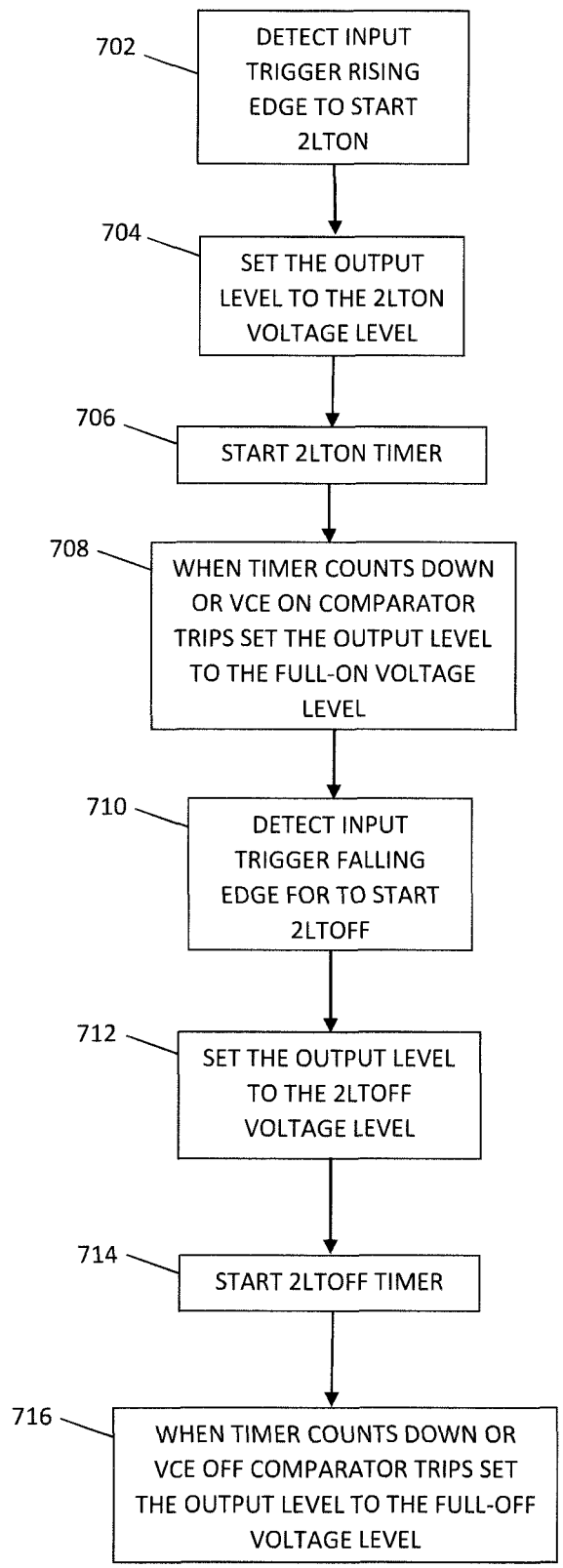
FIGS. 7 and 8 are flow-chart diagrams that are useful for describing the operation of the circuits shown in FIGS. 4, 5 and 6.
Figure 8:
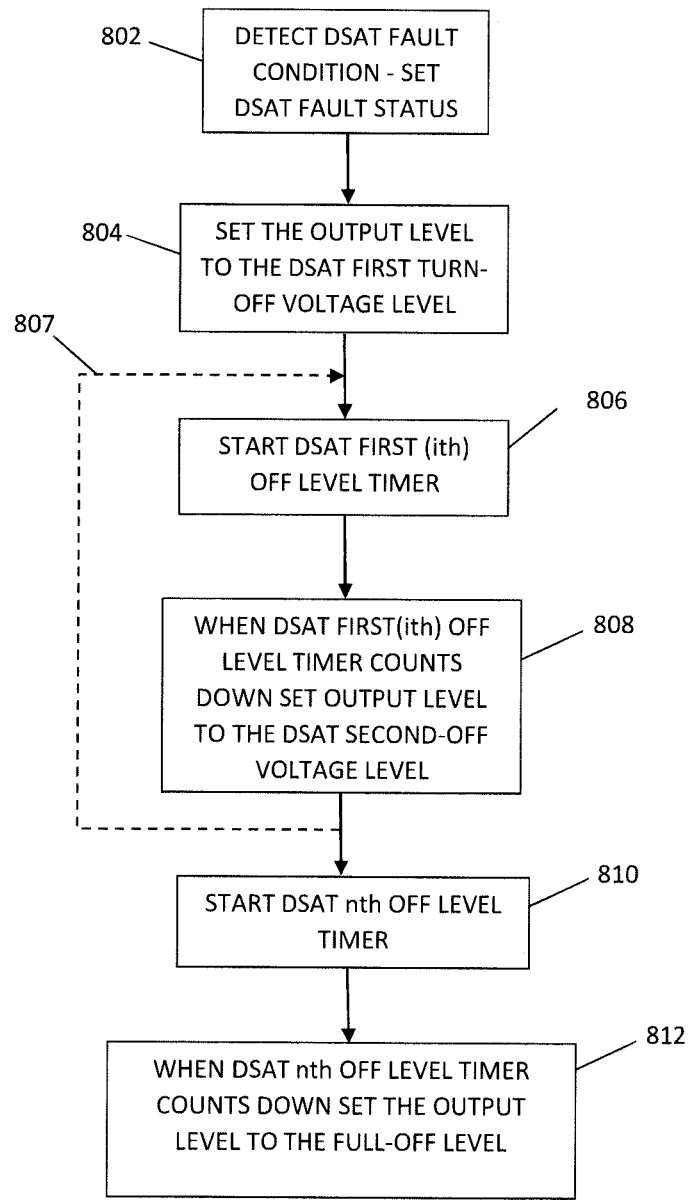

FIGS. 7 and 8 are flow-chart diagrams that illustrate examples of the operation of the MCU 402, 502 or 602 in the circuits shown in FIGS. 4, 5 and 6, respectively. FIG. 7 shows the operation of the systems in a 2LTO mode (both 2LTOff and 2LTOn) while FIG. 8 shows the operation of the system when a DSAT fault condition is detected. A DSAT condition may be detected by monitoring Ic in FIG. 5 to determine when the current through the FET or IGBT is excessive or experiences a sudden increase or by monitoring Vce for an on-state value that is higher than the on-state Vce value when the device is saturated or where the on-state Vce value exhibits a sudden increase. Other systems and methods for handling a DSAT condition are described below with reference to FIGS. 9-12.

In block 702, the MCU detects the rising edge of an input trigger on the input terminal IN. This signal indicates that the FET is to be turned on. Upon detecting this trigger, the MCU, at block 702, begins the 2LTOn operation by selecting the 2LTOn level and 2LTOn timer value. The MCU then applies the 2LTOn level to the gate electrode of the FET through the driver circuit. It also sets the reference value provided to the comparator to an intermediate Vce (or Ic) level which indicates that the FET may be turned on. At block 706, the MCU starts the 2LTOn timer. At block 706, when the timer expires (e.g. has counted down to zero), or when the comparator indicates that the Vce (or Ic) value has reached the reference level, the MCU sets the gate potential to the full-on (high) level.

At block 710, the MCU detects the falling edge of the input trigger IN to begin the turn-off operation. Also in block 710, the MCU selects a reference level and delay time that is appropriate for the 2LTOff operation. At block 712, the MCU causes the 2LTOff level to be applied to the gate electrode of the FET and sets the reference value applied to the comparator to an intermediate value of Vce (or Ic) which indicates that the FET may be turned off. At block 714 the MCU starts the 2LTOff timer. At block 716, when the tinier expires, or when the comparator indicates that the Vce (or Ic) value has reached the reference level, the MCU sets the gate potential to the full-off (low).

FIG. 8 illustrates an example operation when a DSAT fault condition is detected. The algorithm shown in FIG. 8 may be used with the algorithm shown in FIG. 7 to provide a more aggressive turn-off operation when a DSAT condition is detected. At block 802, when the DSAT condition is detected, the MCU sets a DSAT status indicator which, in this example, causes a set of multi-level turn off (MLTO) gate voltage values and corresponding delay times to be selected. At block 804, the MCU sets the signal applied to the gate electrode to the first turn-off gate voltage level and, as block 806 starts the timer to count-down the first delay time. At block 808, when the timer expires, the MCU sets the gate potential to the second (next) off voltage level. As shown by the arrow 807, blocks 806 and 808 may be repeated one or more times to accommodate multiple intervening levels. Arrow 807 is shown in phantom as there may be only a single intermediate level (e.g. 2LTOff). For each level, i, the ith timer is started at block 806 and when it counts down, block 806 sets the i+1$^{st}$ output level and delay values and branches to block 806. When the i+1$^{st}$ level is the same as the nth level, control passes to block 810. At block 810, once the MCU has selected the nth (last) off voltage level, the timer is started with the last delay value. At block 812, when the timer has counted down the last delay value, the MCU sets the gate potential of the FET or IGBT to the full-off voltage level.

When a DSAT condition is detected (in this example, for an SiC FET), there are two methods that can be utilized to manage the turn-off characteristic of the Power Semiconductor Fixed Multi-Level Turn-Off and Vce(or Vds) Feedback Controlled Multi-Level Turn-Off.

Fixed Multi-Level Turn Off

Figure 9:
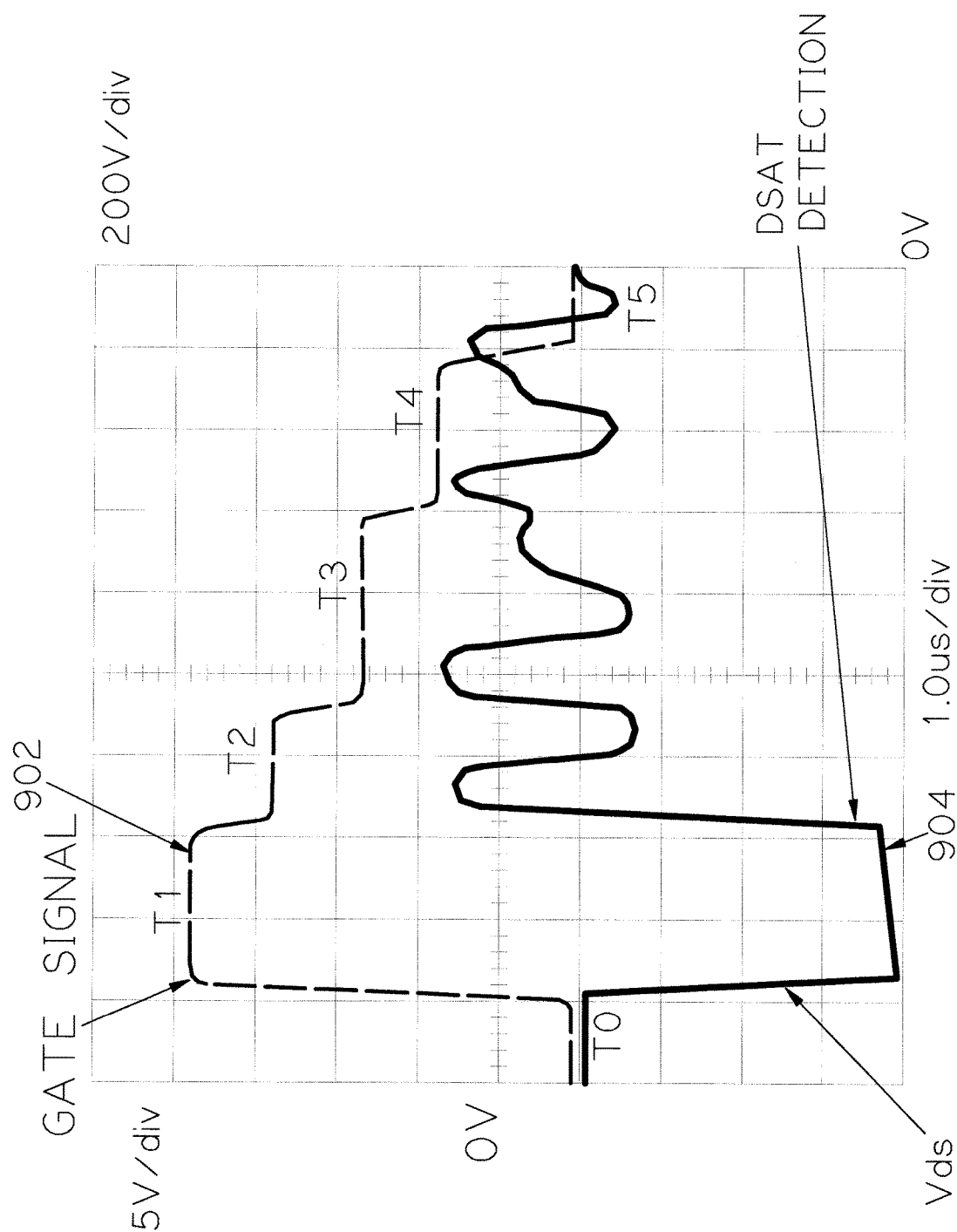
FIG. 9 is a graph showing waveforms of voltage versus time that is useful for describing a control circuit that controls switching when a desaturation event is detected.

In Fixed Multi-Level Turn-Off, the gate signal to the FET is stepped through a fixed set of voltages. Each voltage is held for a predetermined (and possibly different) time interval. In one implementation, the level and time steps are programmable and may be optimized through a characterization procedure. FIG. 9 shows a typical time and voltage sequence for the gate signal 902 and Vds 904. In FIG. 9, the values T0 through T4 represent successive time intervals. The vertical axis on the left side of FIG. 9 corresponds to the gate signal and the vertical scale on the right side corresponds to Vds. In response to detection of a DSAT condition during time interval T1, (e.g. Vds increases to 12V within 2 µs). TABLE 1 describes the details for each event.

TABLE 1

MLTO Event Description

| Event | Description | Time (ns) | Gate Voltage (v) |
|---|---|---|---|
| T0 | Normal OFF State | — | −4 |
| T1 | Normal ON State | >2000 | 18 |
| T2 | $1^{st}$ Level Turn Off occurs after DSAT detection | 500 | 14 |
| T3 | $2^{nd}$ Level Turn Off | 2000 | 9 |
| T4 | $3^{rd}$ level Turn Off | 1500 | 4 |
| T5 | Normal OFF State | — | −4 |

Figure 10:
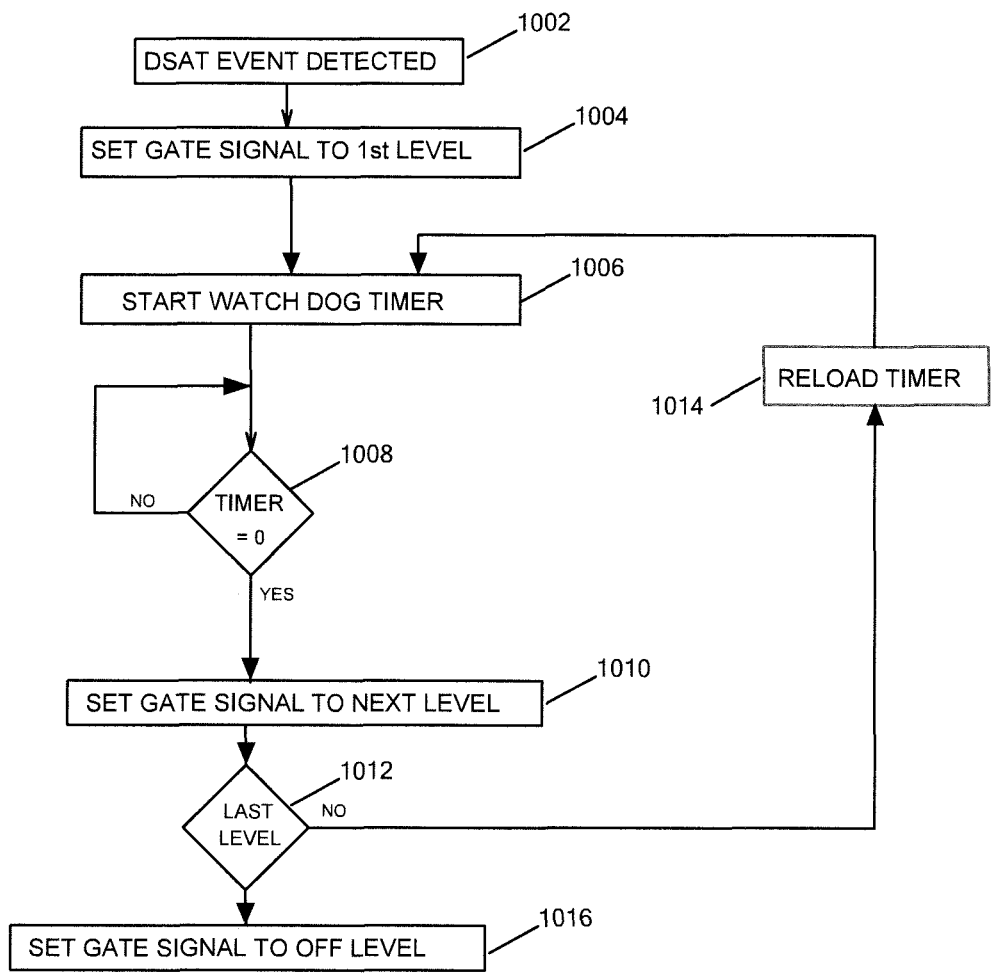
FIGS. 10 and 11 are flow-chart diagrams that are useful for describing the operation of the control circuit that controls switching when a desaturation event is detected.

FIG. 10 shows the sequence of events for the MLTO operation shown in FIG. 9 and TABLE 1. At block 1002, the DSAT condition is detected. As described above, DSAT may be detected by the MCU as a Vds value that is greater than a tolerance value (e.g. 12 v) when the power semiconductor is in an ON state. Alternatively, it may be detected by the MCU as a rapid change in the Vds value. For this method, the MCU may include or be coupled to an analog-to-digital converter (ADC), described below with reference to FIG. 12, that samples the Vds signal in regular intervals, where the sampling interval may be between 10 ns and 500 ns. A DSAT condition may be detected when consecutive samples define a rate change that is greater than a threshold value.

Next, at block 1004, the MCU sets the gate signal to the first reduced level (e.g. 14v) and loads the first time interval (T2) into a watch dog timer that may be internal to the MCU. As shown in the example in TABLE 1, this time value is 500 ns. Blocks 1006, 1008, 1010, 1012 and 1014 form a loop that is executed for each interval and each step of the gate voltage. In this example T2 is the current interval for the first time through the loop.

At block 1006, the MCU starts the timer for the current interval and transfers control to block 1008 which monitors the timer and, when the timer counts down to zero, transfers control to block 1010. Block 1010 selects the gate signal to be applied at the end of the current interval. The MCU, at block 1012, determines whether the gate signal level selected at block 1010 is the last level in the sequence. If it is not, block 1014 loads the interval corresponding to the selected level into the timer and transfers control to block 1006 to hold the gate signal at the proscribed voltage for the new time interval, which becomes the current time interval. The loop defined by blocks 1006-1014 repeats until block 1010 determines that the selected gate level signal is the last level (e.g. the OFF state). When this occurs, block 1016 holds the gate signal at the OFF level.

The loop formed by blocks 1006 through 1014 in FIG. 10 sequentially steps the gate voltage from the 18 v ON voltage, to a first step (during T2) of 14 v, a second step (during T3) of 9 v, a third step (during T4) of 4 v and finally, to −4 v, the OFF voltage. Although the flow-chart shows a single counter being loaded at the end of each interval, it is contemplated that a separate counter (not shown) may be pre-loaded and activated for each interval or, alternatively, that two counters (not shown) may be used in a Ping-Pong manner so that one counter is loaded with the next time interval while the other counter is counting down the current interval.

VCE/DS Feedback Controlled Multi-Level Turn-Off.

Figure 11:
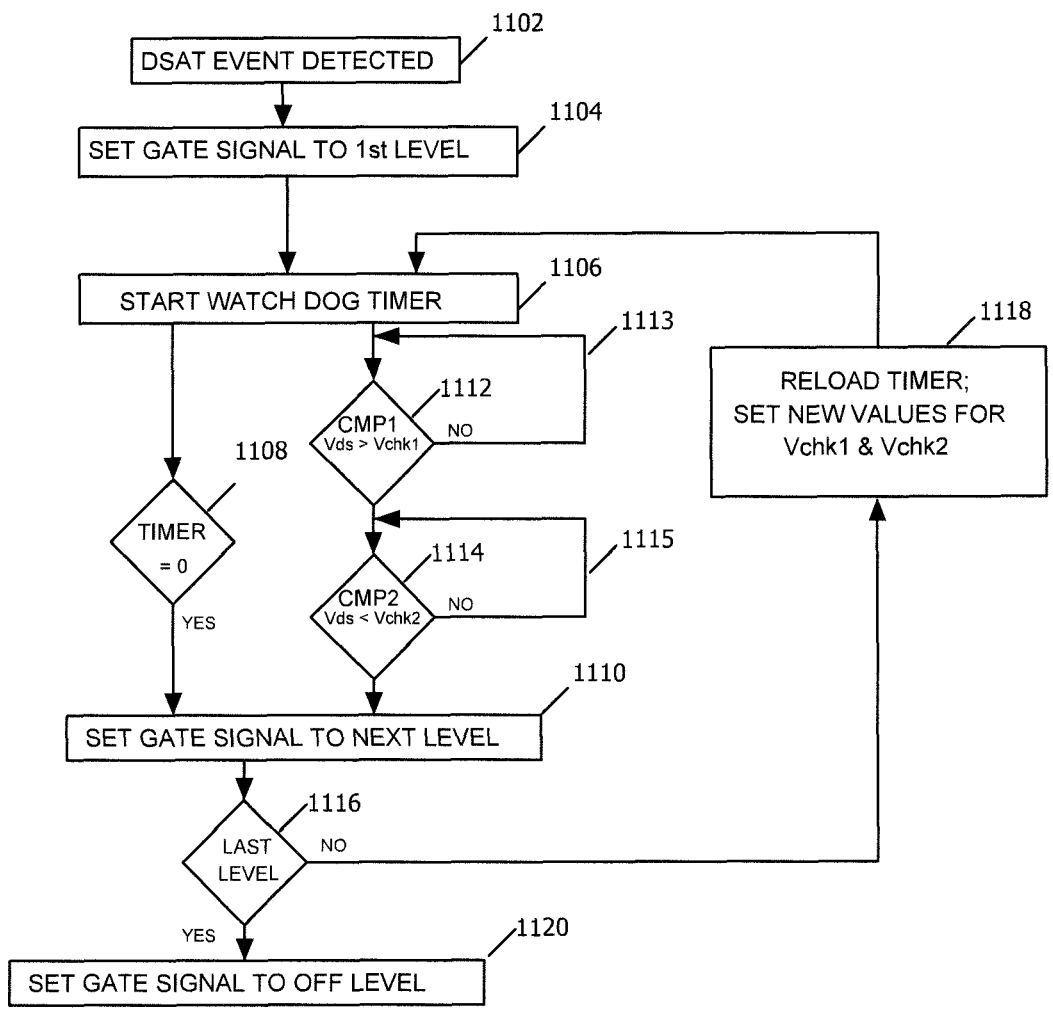

FIG. 11 is a flow-chart that illustrates how Vce/Vds may be monitored to determine when to step to next voltage level in the MLTO sequence. The example system, described below with reference to FIG. 12, uses two comparators to determine when the over voltage spike rises above a predetermined voltage, VCHK1, and falls below another predetermined voltage, VCHK2. This falling voltage change indicates that the voltage spike caused by the previous step has subsided and that next step in the turn-off process can proceed. Switching to the next voltage level based on the state of the system, rather than waiting for a set of fixed times, allows the MLTO process to be optimized and shut down the power device as quickly as possible to reduce possible damage.

Prior to block 1102, the power semiconductor device is turned ON (e.g. gate voltage is 18 v). At block 1102, the MCU detects a DSAT condition. The MCU may detect the DSAT condition in the same way as described above with reference to block 1002. As soon as the DSAT condition is detected, the MCU begins the MLTO operation by setting the gate signal to the first level (e.g. 14 v) and, optionally, loading the first count-down value (e.g. T2) into the watch dog timer. When a watch dog timer is used, the MCU starts the timer at block 1106.

When the timer is not used, or in parallel with the timer count-down when the timer is used, block 1112 determines whether Vds is greater than VCHK1. As described above, when the gate voltage is reduced, the channel resistance of the power semiconductor device will increase, increasing Vds. Immediately after the gate voltage is reduced, Vds may also exhibit a voltage spike. VCHK1 is a Vds voltage that is greater by a predetermined amount (e.g. 1 to 10 percent) than the Vds voltage prior to the change in gate voltage, VCHK2 is a voltage value greater than VCHK1 but less than VCHK1 plus the anticipated voltage spike. Thus VCHK2 represents an upper target level for Vds after the voltage spike has subsided. The MCU, at block 1114, determines whether Vds is less than VCHK2. Although the comparisons are described as "greater than" in block 1112 and "less than" in block 1114, it is contemplated that these comparisons may be "greater than or equal to" or "less than or equal to" respectively.

If the watch dog timer is used, when block 1112 determines that Vds is not greater than VCHK1, and when block 1114 determines the Vds is not less than VCHK2, control is transferred to block 1106 to continue to decrement the timer. When the timer is not used, blocks 1112 and 1114 continually test the value of Vds until the conditions have been met. This operation is indicated by the phantom lines 1113 and 1115.

After block 1114 determines that Vds is less than VCHK2, block 1110 sets the gate signal to the next level. When the watch dog timer is used, and the timer expires before block 1112 determines that Vds is greater than VCHK1 and/or block 1114 determines that Vds is less than VCHK2, the expiration of the timer causes control to be transferred to block 1110.

At block 1116, the MCU determines whether the level set in block 1110 is the OFF voltage. When it is, control transfers to block 1120 which holds the gate signal applied to the power semiconductor device at the OFF level. When block 1116 determines that the level applied at block 1110 is not the last level, block 1116 transfers control to block 1118 to load the values for VCHK1 and VCHK2 for the next step. When the watch dog timer is being used, the next time interval (e.g. T3, T4, etc.) is loaded into the timer at block 1118.

The watch dog timer may be used to guard against a comparator sequence malfunction. If a rising Vds does not reach VCHK1 or if the subsequent falling Vds does not reach VCHK2 then the watch dog timer times out and causes the gate signal to sequence to the next Voltage level. This condition may occur if the L*dI/dt does not result in a voltage spike high enough to reach the voltage VCHK1 at block 1112 or if the VDS does not fall low enough to reach voltage VCHK2 at block 1114.

Figure 12:
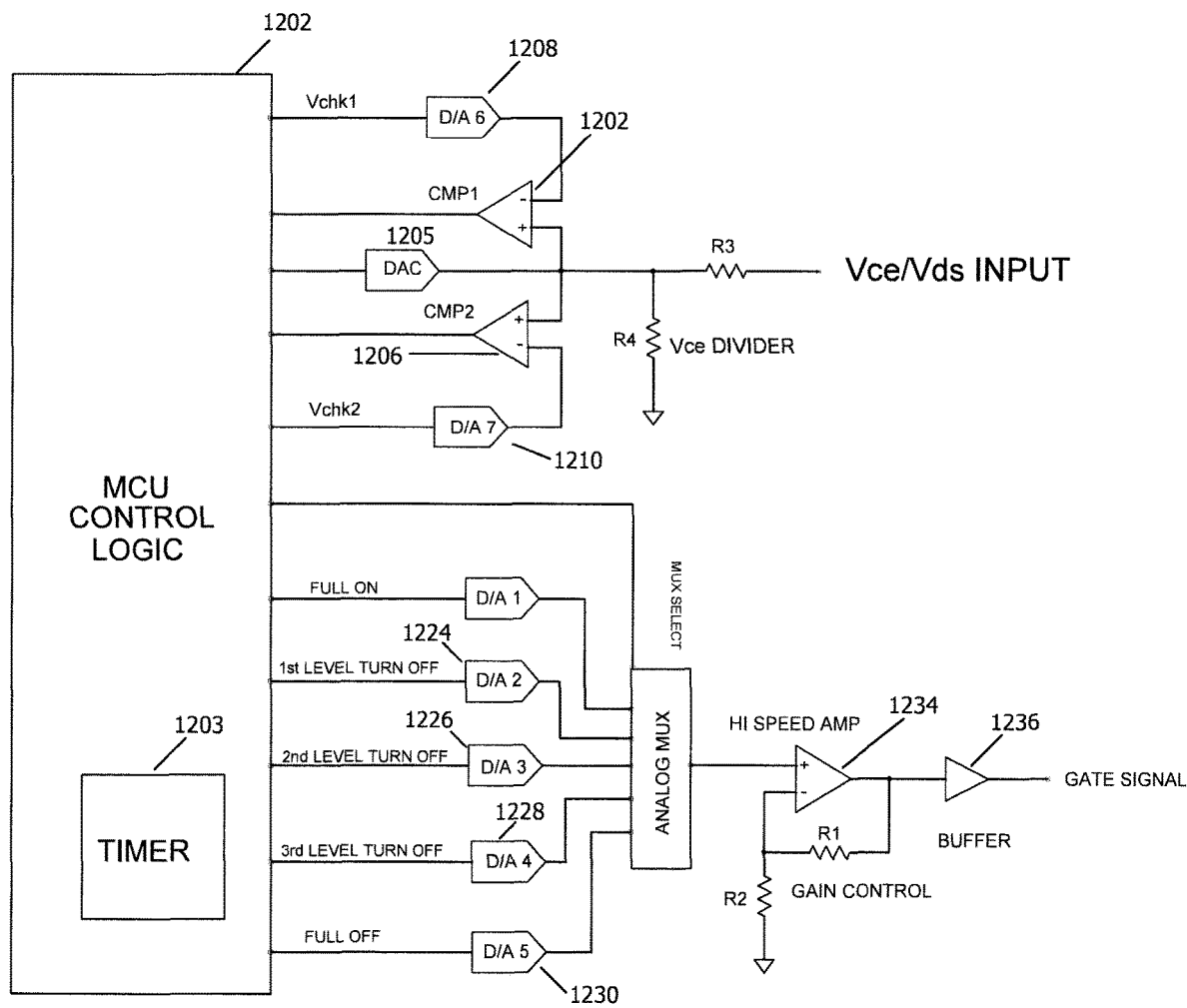
FIG. 12 is block diagram, partly in schematic diagram form of an example circuit that controls switching when a desaturation event is detected.

FIG. 12 is a block diagram, partly in schematic diagram form, of an example MCU that may be used to implement the processes described in FIGS. 10 and 11. The control logic 1202 includes an internal timer 1203, registers (not shown), memory (not shown) and a state machine (not shown) that implements the processes described in FIG. 10 and/or FIG. 11. As described above, the control logic may be implemented as a stand-alone or embedded microprocessor, microcontroller, or DSP. Alternatively, it may be implemented as an ASIC, FPGA or CPLD. In another alternative, it may be implemented using discrete logic circuitry. In one implementation, the control logic may include circuitry, such as the MCU 402 and driver 404 may include circuitry such as the MCU, interface board and driver board of the system described in above-referenced U.S. Pat. No. 8,984,197.

The control logic is configured to receive Boolean output signals provided by comparators 1204 and 1206. One input to the comparators is a voltage proportional to either Vce or Vds, provided by a voltage divider that includes resistors R3 and R4. Resistors R3 and R4 are selected to have a combined high impedance (e.g. greater than 1 megohm) and to scale the expected range of the Vce/Vds signal to a range that is compatible with the input signal range of the comparators 1204 and 1206. The signal provided by the voltage divider may also be applied to an ADC 1205 to produce digitized values that are monitored by the MCU 1202 as described above, to determine the occurrence of a DSAT condition.

The expected range of the Vce/Vds signal desirably includes a worst-case voltage spike that may occur on switching the power semiconductor device. Thus, the vales of R3 and R4 depend on the expected value of Vce/Vds when the device is turned off, the input range of the comparators 1204 and 1206, the parasitic inductance of the circuitry that includes the power semiconductor device, and the expected values of dv/dt for Vds.

The other inputs to the comparators 1204 and 1206 are provided by respective digital-to-analog converters (DACs) 1208 and 1210. DAC 1208 converts a digital value for VCHK1 provided by the control logic 1202 into an analog value and applies the analog value to the comparator 1204 so that it may be compared with the scaled Vce/Vds signal across R4. Similarly, DAC 1210 converts a digital value for VCHK2 provided by the control logic 1202 into an analog value and applies the analog value to the comparator 1206 so that it may be compared with the scaled Vce/Vds signal. The DACs 1208 and 1210 as well as the comparators 1204 and 1206 are used to implement blocks 1112 and 1114 of FIG. 11.

In addition to implementing blocks 1112, the comparator 1204 may be used to detect the DSAT condition. In this implementation, the value provided to the DAC 1208 may be a threshold value of Vce/Vds that, when the semiconductor device is turned on, indicates the occurrence of a DSAT condition. Thus, upon receiving a trigger signal to turn on the semiconductor device, the control logic 1202 may apply the DSAT threshold value to the DAC 1208 and monitor the output signal of comparator 1204 while the ON voltage (e.g. 18 v) is applied to the gate of the semiconductor device.

The example circuitry shown in FIG. 12 also includes five DACs 1222, 1224, 1226, 1228, and 1230. These DACs receive digital values from MCU 1202 corresponding to the respective gate voltages used in the MLTO operation. The DACs convert these digital values to analog signals that are applied to an analog multiplexer 1232. The multiplexer is controlled by a MUX SELECT signal provided by the MCU 1202. The output signal of the multiplexer 2132 is applied to a high-speed operational amplifier 1234 having a gain determined by two gain control resistors R1 and R2. The output signal of the amplifier 1234 is applied to a buffer amplifier 1236 which is connected to the gate electrode of the power semiconductor device. The operational amplifier 1234 and buffer circuit 1236 operate in the same way as the operational amplifiers 404 and 504, described above with reference to FIGS. 4 and 5.

The example configuration shown in FIG. 12 uses five DACs each coupled to a respective programmable register (not shown) internal to the control logic 1202. The values stored in these registers are determined when the power semiconductor device is characterized to determine the range of the scaled values for Vce/Vds and to determine the particular gate voltages to be used in the various levels of the MLTO. These values may be set when the device is first turned on and may be changed during the operation of the power semiconductor device, for example, based on the temperature and age of the device. Having the separate values applied to the analog multiplexer 1232 allows the system to rapidly change the gate voltage of the device. The delay between the control logic 1202 providing the MUX SELECT signal and the gate voltage being applied is only the propagation delay in the high-speed operational amplifier 1234 and buffer 1236.

Although FIG. 12 shows the DACs 1208, 1210, 1222, 1224, 1226, 1228 and 1230 as being external to the MCU control logic 1202, it is contemplated that one or more of these DACs may be internal to the MCU control logic 1202 such that the MCU provides drive signals directly to the analog multiplexer 1232.

Aspects of the methods of the exemplary apparatus and method outlined above may be embodied in programming, e.g. in the form of software, firmware, or microcode executable by a user computer system, a server computer or other programmable device. Program aspects of the technology may be thought of as "products" or "articles of manufacture" typically in the form of executable code and/or associated data that is carried on or embodied in a type of machine readable medium. "Storage" type media include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to one or more of "non-transitory," "tangible" or "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-transitory storage media include, for example, optical or magnetic disks, such as any of the storage devices in any computer(s) or the like. It may also include storage media such as dynamic memory, for example, the main memory of a computer platform. Tangible transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and light-based data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Program instructions may comprise a software or firmware implementation encoded in any desired language. Programming instructions, when embodied in machine readable medium accessible to a processor of a computer system or device, render computer system or device into a special-purpose machine that is customized to perform the operations specified in the program.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical or similar elements in the process, method, article, or apparatus that comprises the element.

The term "coupled" as used herein refers to any logical, physical or electrical connection, link or the like by which signals produced by one system element are imparted to another "coupled" element. Unless described otherwise, coupled elements or devices are not necessarily directly connected to one another and may be separated by intermediate components, elements or communication media that may modify, manipulate or carry the signals. Each of the various couplings may be considered a separate communications channel.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed:

1. A gate-drive controller for a power semiconductor device comprising:
    a master control unit (MCU) having an input terminal configured to receive a trigger signal and an output terminal that provides a drive signal for the power semiconductor device; and
    a comparator, having an output terminal coupled to the MCU and first and second input terminals, the first input terminal coupled to receive a signal representing an output signal of the semiconductor device, the second input terminal coupled to the MCU to receive a target value representing an expected value of an output signal of the power semiconductor device, and the output terminal coupled to provide a Boolean output signal having a first value when the signal representing the output signal of the power semiconductor device is greater than the target value and having a second value when the signal representing the output signal of the power semiconductor is less than or equal to the target value;
    wherein the MCU includes program instructions that cause the MCU to:
        generate a first drive signal for the power semiconductor device and a first target value for the comparator when the trigger signal indicates that the power semiconductor device is to be changed from a first state to a second state;
        hold the first drive signal until the Boolean signal exhibits a first transition between the first value and the second value;
        provide a second drive signal, different from the first drive signal, and a second target value to the comparator in response to the first transition of the Boolean signal between the first and second values;
        hold the second drive signal until the Boolean signal exhibits a second transition between the first and second values; and
        provide a third drive signal, different from the first and second drive signals, in response to the second transition of the Boolean signal.

2. The gate drive controller of claim 1, wherein the first state is an on-state in which current flows through the power semiconductor device and the second state is an off-state in which current does not flow through the power semiconductor device.

3. The gate drive controller of claim 1, wherein the first state is an off-state in which current does not flow through the power semiconductor device and the second state is an on-state in which current flows through the power semiconductor device.

4. The gate drive controller of claim 1, wherein the power semiconductor device is selected from a group consisting of an silicon IGBT, a SiC FET, a GaN FET, an AlN FET and a BN FET.

5. The gate drive controller of claim 1, further comprising:
a further comparator having an output terminal coupled to the MCU and first and second input terminals, the first input terminal of the further comparator being coupled to receive a signal representing an output signal of the power semiconductor device, the second input terminal of the further comparator being coupled to receive a first further target value representing a further expected value of the output signal of the power semiconductor device after a power fluctuation in the output signal of the power semiconductor device has subsided, the power fluctuation resulting from the drive signal being changed, and the output terminal being configured to provide a further Boolean output signal having a first value when the signal representing the output signal of the power semiconductor device is less than the first further target value and having a second value when the signal representing the output signal of the power semiconductor is greater than or equal to the first further target value;
wherein:
the program instructions that cause the MCU to hold the first drive signal until the Boolean signal exhibits the first transition between the first value and the second value further cause the MCU to hold the first drive signal until both the Boolean signal and the further Boolean signal exhibit respective first transitions between the first value and the second value;
the program instructions that cause the MCU to provide a second drive signal, different from the first drive signal, and a second target value to the comparator in response to the first transition of the Boolean signal between the first and second values further cause the MCU to provide a second further target signal to the further comparator; and
the program instructions that cause the MCU to hold the second drive signal until the Boolean signal exhibits the second transition between the first value and the second value further cause the MCU to hold the second drive signal until both the Boolean signal and the further Boolean signal exhibit respective second transitions between the first value and the second value.

6. The gate drive controller of claim 1, wherein:
the MCU includes first, second and third drive output terminals, the first drive output terminal providing the first drive signal, the second drive output terminal providing the second drive signal and the third drive output terminal providing the third drive signal;
the gate drive controller further comprises a multiplexer having first, second and third input terminals coupled respectively to the first, second and third drive output terminals of the MCU, an output terminal coupled to provide the drive signal to the power semiconductor device and a control terminal coupled to the MCU to receive a control signal; and the program instructions cause the MCU to:
control the multiplexer to provide the first drive signal responsive to the MCU receiving the trigger signal,
control the multiplexer to provide the second drive signal when the Boolean signal exhibits the first transition between the first value and the second value; and
control the multiplexer to provide the third drive signal in response to the transition of the Boolean signal between the first value and the second value.

7. The gate drive controller of claim 1, further comprising:
a timer configured to be set to count-down value by the MCU, the timer providing a signal to the MCU when the count-down value has counted down to zero;
wherein:
the program instructions that cause the MCU to generate the first drive signal and the first target value further cause the MCU to provide a first count-down value to the timer;
the program instructions that cause the MCU to hold the first drive signal until the Boolean signal exhibits the first transition between the first value and the second value further cause the MCU to hold the first drive signal until the earlier occurring of the timer value counting the first count-down value to zero or the Boolean signal exhibiting the first transition between the first value and the second value;
the program instructions that cause the MCU to provide the second drive signal and the second target value further cause the MCU to provide a second count-down value to the timer;
the program instructions that cause the MCU to hold the second drive signal until the Boolean signal exhibits the second transition between the first value and the second value further cause the MCU to hold the second drive signal until the earlier occurring of the timer value counting the second count-down value to zero or the Boolean signal exhibiting the second transition between the first value and the second value.

8. A gate-drive controller for a power semiconductor device comprising:
a master control unit (MCU) having a first input terminal configured to receive a desaturation (DSAT) signal indicating that the power semiconductor device is experiencing a DSAT condition and an output terminal that provides a drive signal for the power semiconductor device; and
a comparator having an output terminal coupled to the MCU and first and second input terminals, the first input terminal coupled to receive a signal representing an output signal of the power semiconductor device, the second input terminal coupled to receive, from the MCU, a target value representing an expected value of the output signal of the power semiconductor device and to provide, at the output terminal, a Boolean output signal having a first value when the signal representing the output signal of the power semiconductor device is greater than the target value and having a second value when the signal representing the output signal of the power semiconductor is less than or equal to the target value;
wherein the MCU includes program instructions that cause the MCU to:
generate a first drive signal for the power semiconductor device and a first target value for the comparator when the DSAT signal indicates that the power semiconductor device experiencing a DSAT condition;

hold the first drive signal until the Boolean signal exhibits a first transition between the first value and the second value;

provide a second drive signal, different from the first drive signal, and a second target value to the comparator in response to the first transition of the Boolean signal between the first and second values;

hold the second drive signal until the Boolean signal exhibits a second transition between the first and second values; and provide a third drive signal, different from the first and second drive signals, in response to the second transition of the Boolean signal.

9. The gate drive controller of claim 8, wherein the power semiconductor device is selected from a group consisting of an silicon IGBT, a SiC FET, a GaN FET, an AlN FET and a BN FET.

10. The gate drive controller of claim 8, further comprising:

a further comparator, the further comparator being coupled to receive a first further target value from the MCU, the first further target value representing a first further expected value of the output signal of the power semiconductor device after a power fluctuation in the output signal of the power semiconductor device has subsided, the power fluctuation resulting from the drive signal being changed, and to provide a further Boolean output signal having a first value when the output signal of the power semiconductor device is less than the further expected value and having a second value when the output signal of the power semiconductor is greater than or equal to the further expected value;

wherein:

the program instructions that cause the MCU to hold the first drive signal until the Boolean signal exhibits the first transition between the first value and the second value further cause the MCU to hold the first drive signal until both the Boolean signal and the further Boolean signal exhibit respective first transitions between the first value and the second value;

the program instructions that cause the MCU to provide a second drive signal, different from the first drive signal, and a second target value to the comparator in response to the first transition of the Boolean signal between the first and second values further cause the MCU to provide a second further target signal to the further comparator; and the program instructions that cause the MCU to hold the second drive signal until the Boolean signal exhibits the second transition between the first value and the second value further cause the MCU to hold the second drive signal until both the Boolean signal and the further Boolean signal exhibit respective second transitions between the first value and the second value.

11. The gate drive controller of claim 8, wherein:

the MCU includes first, second and third drive output terminals, the first drive output terminal providing the first drive signal, the second drive output terminal providing the second drive signal and the third drive output terminal providing the third drive signal;

the gate drive controller further comprises a multiplexer having a control input terminal, first, second and third signal input terminals coupled respectively to the first, second and third drive output terminals of the MCU and an output terminal coupled to provide a selected one of the first, second and third drive signal to the power semiconductor device in response to a selection control signal applied to the control terminal of the multiplexer; and the program instructions:

cause the MCU to control the multiplexer to select the first drive signal when responsive to the MCU receiving the DSAT signal, cause the MCU to control the multiplexer to select the second drive signal when the Boolean signal exhibits the first transition between the first value and the second value; and cause the MCU to control the multiplexer to select the third drive signal when the Boolean signal exhibits the second transition between the first value and the second value.

12. The gate drive controller of claim 8, further comprising:

a timer configured to be set to count-down value by the MCU, the timer providing a signal to the MCU when the count-down value has counted down to zero;

wherein:

the program instructions that cause the MCU to generate the first drive signal and the first target value further cause the MCU to provide a first count-down value to the timer;

the program instructions that cause the MCU to hold the first drive signal until the Boolean signal exhibits the first transition between the first value and the second value further cause the MCU to hold the first drive signal until the earlier occurring of the timer value counting the first count-down value to zero or the Boolean signal exhibiting the first transition between the first value and the second value;

the program instructions that cause the MCU to provide the second drive signal and the second target value further cause the MCU to provide a second count-down value to the timer;

the program instructions that cause the MCU to hold the second drive signal until the Boolean signal exhibits the second transition between the first value and the second value further cause the MCU to hold the second drive signal until the earlier occurring of the timer value counting the second count-down value to zero or the Boolean signal exhibiting the second transition between the first value and the second value.

13. A gate-drive controller for a power semiconductor device comprising:

a master control unit (MCU) having a desaturation (DSAT) input terminal configured to receive a DSAT signal, a first output terminal configured to provide a DSAT comparison value and a second output terminal that provides a drive signal for the power semiconductor device;

a DSAT detector coupled to the power semiconductor device to determine the occurrence of a DSAT condition;

wherein the MCU includes program instructions that cause the MCU to:

generate a first drive signal for the power semiconductor device when a DSAT condition has occurred;

hold the first drive signal for a first predetermined time interval;

provide a second drive signal, different from the first drive signal, at the end of the first predetermined time interval;

hold the second drive signal for a second predetermined time; and provide a third drive signal, different from the first and second drive signals, at the end of the second predetermined time interval.

14. The gate drive controller of claim 13, wherein the DSAT detector comprises a comparator having a first input terminal coupled to receive a signal representing an output signal of the power semiconductor device, a second input terminal coupled to the MCU to receive a DSAT comparison value and an output terminal coupled to a DSAT input terminal of the MCU.

15. The gate drive controller of claim 13, wherein the DSAT detector comprises an analog-to-digital converter (ADC) coupled to provide successive digital samples of a signal representing the output signal of the power semiconductor device, wherein the program instructions cause the MCU to calculate a rate of change of the successive samples and to indicate a DSAT condition when the calculated rate of change is greater than a threshold value.

16. The gate drive controller of claim 13, wherein the power semiconductor device is selected from a group consisting of an silicon IGBT, a SiC FET, a GaN FET, an AlN FET and a BN FET.

17. A gate-drive controller for a power semiconductor device comprising:
   a comparator having a reference input terminal, a signal input terminal, coupled to receive an output signal of the power semiconductor device, and an output terminal, the comparator providing a Boolean output signal that is in a first state when a value of a signal applied to the signal input terminal is less than a reference value applied to the reference input terminal and in a second state when the value of the signal applied to the signal input terminal is greater than or equal to the reference value applied to the reference input terminal;
   a master control unit (MCU) having a first input terminal configured to receive a turn-off trigger signal, a second input terminal configured to receive the Boolean signal provided by the comparator, a third input terminal configured to receive a de-saturation (DSAT) signal, a first output terminal configured to provide a drive signal for the power semiconductor device and a second output terminal configured to provide the reference value to the reference input terminal of the comparator;
   wherein the MCU includes program instructions that cause the MCU to:
      generate a first intermediate drive signal for the power semiconductor device when the trigger signal indicates that the power semiconductor device is to be turned off;
      generate a second intermediate drive signal, different from the first drive signal, when the DSAT signal indicates that the power semiconductor device is experiencing de-saturation; and
      to generate a final drive signal for the power semiconductor when the Boolean signal indicates that the output signal from the power semiconductor device has changed.

18. The gate drive controller of claim 17 wherein the signal input terminal of the comparator is coupled to receive a voltage signal representing a voltage across the power semiconductor device and the program instructions cause the MCU to generate the final drive signal when the output signal of the power semiconductor is greater than the reference value.

19. The gate drive controller of claim 17 wherein the signal input terminal of the comparator is coupled to receive a voltage signal representing a current flowing through the power semiconductor device and the program instructions cause the MCU to generate the final drive signal when the output signal of the power semiconductor is less than the reference value.

20. The gate drive controller of claim 19 further comprising
   a further comparator having further reference input terminal, a further signal input terminal coupled to receive a voltage signal representing the voltage across the power semiconductor device and a further output terminal, the further comparator providing a further Boolean output signal that changes state from a first value to a second value when the voltage across the semiconductor device becomes less than the value applied to the further reference input terminal;
   wherein the program instructions further cause the MCU to generate the final drive signal when the Boolean signal indicates that the signal applied to the input terminal of the comparator is less than the reference value or when the further signal applied to the further input terminal of the further comparator is greater than the further reference value.

21. The gate drive controller of claim 17, wherein the program instructions further cause the MCU to set a timer to a first value when the first intermediate drive signal is generated and to set the timer to a second value with the second intermediate drive signal is generated and to cause the MCU to generate the final drive signal when the timer expires regardless of the state of the Boolean signal.

22. The gate drive controller of claim 17, further comprising a temperature sensor, coupled to provide a signal representing a temperature of the power semiconductor device to the MCU;
   wherein the program instructions further cause the MCU to change the reference value in response to changes in the temperature of the power semiconductor device.

23. The gate drive controller of claim 17, wherein the power semiconductor device is selected from a group consisting of an silicon IGBT, a SiC FET, a GaN FET, an AlN FET and a BN FET.

24. A gate-drive controller for a power semiconductor device comprising:
   a comparator having a reference input terminal, a signal input terminal, coupled to receive an output signal of the power semiconductor device, and an output terminal, the comparator providing a Boolean output signal that is in a first state when a value of a signal applied to the signal input terminal is less than a reference value applied to the reference input terminal and in a second state when the value of the signal applied to the signal input terminal is greater than or equal to the reference value applied to the reference input terminal;
   a master control unit (MCU) having a first input terminal configured to receive a trigger pulse having a rising edge and a falling edge, a second input terminal configured to receive the Boolean signal provided by the comparator, a first output terminal configured to provide a drive signal for the power semiconductor device and a second output terminal configured to provide the reference value to the comparator;

wherein the MCU includes program instructions that cause the MCU to:
in response to detecting the rising edge of the trigger pulse, generate a first reference value and a first drive signal for the power semiconductor device the first drive signal tending to turn the power semiconductor device partially on;
generate a second drive signal for the power semiconductor device when the Boolean signal changes between the first state and the second state, wherein the second drive signal tends to turn the power semiconductor device completely on;
in response to the falling edge of the trigger pulse, generate a second reference value and a third drive signal for the power semiconductor device, the third drive signal tending to turn the power semiconductor device partially off;
generate a fourth drive signal for the power semiconductor device when the Boolean signal changes between the second state and the first state, the fourth drive signal tending to turn the power semiconductor device completely off.

25. The gate drive controller of claim 24 wherein the signal input terminal of the comparator coupled to receive a voltage signal representing a voltage across the power semiconductor device and the program instructions cause the MCU to generate the fourth drive signal when the output signal of the power semiconductor is greater than the reference value.

26. The gate drive controller of claim 24 wherein the signal input terminal of the comparator is configured to receive a voltage signal representing a current flowing through the power semiconductor device and the program instructions cause the MCU to generate the fourth drive signal when the output signal of the power semiconductor is less than the reference value.

27. The gate drive controller of claim 26 further comprising
a further comparator having further reference input terminal, a further signal input terminal coupled to receive a voltage signal representing the voltage across the power semiconductor device, the further comparator providing a further Boolean output signal that is in a first state when a value of a voltage signal applied to the further signal input terminal is less than the further value applied to the further reference input terminal and in a second state when the value of the voltage signal applied to the signal input terminal is greater than or equal to the further value applied to the further reference input terminal;

wherein the program instructions further cause the MCU to
generate the second drive signal when either the Boolean signal or the further Boolean signal changes between the first state and the second state; and
generate the fourth drive signal when either the Boolean signal or the further Boolean signal changes between the second state and the first state.

28. The gate drive controller of claim 24, wherein the program instructions further cause the MCU to:
set a timer to a first value when the first drive signal is generated;
generate the second drive signal when the timer expires regardless of the state of the Boolean signal;
to set the timer to a second value when the third drive signal is generated; and
generate the fourth drive signal when the timer expires regardless of the state of the Boolean signal.

29. The gate drive controller of claim 24, further comprising a temperature sensor, coupled to provide a signal representing a temperature of the power semiconductor device to the MCU;
wherein the program instructions further cause the MCU to change at least one of the first and second reference values in response to changes in the temperature of the power semiconductor device.

30. The gate drive controller of claim 24, wherein the power semiconductor device is selected from a group consisting of an silicon IGBT, a SiC FET, a GaN FET, an AlN FET and a BN FET.

31. The gate drive controller of claim 24, including a further comparator, having a further reference input terminal, a further signal input terminal, coupled to receive the output signal of the power semiconductor device, and a further output terminal, the further comparator providing a further Boolean output signal that is in a first state when a value of a signal applied to the further signal input terminal is less than a reference value applied to the further reference input terminal and in a second state when the value of the signal applied to the further signal input terminal is greater than or equal to the reference value applied to the further reference input terminal; and
the program instructions cause the MCU to apply the first reference value to the comparator and the second reference value to the further comparator and to generate the fourth drive signal when the further Boolean signal changes between the second state and the first state.

* * * * *